United States Patent
Shoyama

(10) Patent No.: US 10,854,654 B2
(45) Date of Patent: Dec. 1, 2020

(54) SEMICONDUCTOR APPARATUS AND METHOD OF MANUFACTURING THE SAME

(71) Applicant: CANON KABUSHIKI KAISHA, Tokyo (JP)

(72) Inventor: Toshihiro Shoyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/256,131

(22) Filed: Jan. 24, 2019

(65) Prior Publication Data

US 2019/0237495 A1    Aug. 1, 2019

(30) Foreign Application Priority Data

Jan. 31, 2018    (JP) .................................. 2018-015507

(51) Int. Cl.
   *H01L 27/146*    (2006.01)
(52) U.S. Cl.
   CPC .... *H01L 27/1463* (2013.01); *H01L 27/14643* (2013.01); *H01L 27/14689* (2013.01); *H01L 27/14634* (2013.01)
(58) Field of Classification Search
   CPC ........... H01L 27/1463; H01L 27/14643; H01L 27/14689; H01L 27/14634
   USPC ...................................................... 257/292
   See application file for complete search history.

(56) References Cited

U.S. PATENT DOCUMENTS

| | | | |
|---|---|---|---|
| 7,884,440 B2 | 2/2011 | Chung | |
| 9,508,768 B2 | 11/2016 | Kokumai | |
| 9,704,909 B2 | 7/2017 | Kaneda | |
| 2008/0035963 A1* | 2/2008 | Kwon | H01L 27/14609 257/291 |
| 2010/0140668 A1* | 6/2010 | Stevens | H01L 27/1463 257/225 |
| 2010/0203670 A1* | 8/2010 | Ohtani | H01L 27/14689 438/98 |
| 2011/0089513 A1* | 4/2011 | Endo | H01L 27/1463 257/431 |

(Continued)

FOREIGN PATENT DOCUMENTS

| | | |
|---|---|---|
| JP | 11-297703 A | 10/1999 |
| JP | 2007-294973 A | 11/2007 |
| JP | 2009-194269 A | 8/2009 |

(Continued)

OTHER PUBLICATIONS

English Machine Translation of Japanese Patent No. JP 2011/044494 (Year: 2011).*
Kaneda et al., U.S. Appl. No. 16/196,389, filed Nov. 20, 2018.

*Primary Examiner* — Dzung Tran
(74) *Attorney, Agent, or Firm* — Venable LLP

(57) ABSTRACT

A method of manufacturing a semiconductor apparatus, includes forming a first trench on a side of a first face of a semiconductor substrate having the first face and a second face, forming a gettering region by implanting ions in the semiconductor substrate through the first trench, and forming a second trench on the side of the first face of the semiconductor substrate after the forming the gettering region. A depth of a bottom surface of the second trench with reference to the first face is smaller than a depth of a bottom surface of the first trench with reference to the first face.

21 Claims, 13 Drawing Sheets

(56) References Cited

U.S. PATENT DOCUMENTS

2017/0005123 A1   1/2017   Kokumai
2018/0166591 A1*  6/2018   Shoyama ............... H04N 5/369

FOREIGN PATENT DOCUMENTS

| JP | 2011-044494 A | 3/2011 |
| JP | 2014-204047 A | 10/2014 |
| JP | 2016-184624 A | 10/2016 |

* cited by examiner

SEMICONDUCTOR APPARATUS AND METHOD OF MANUFACTURING THE SAME

BACKGROUND OF THE INVENTION

Field of the Invention

The present invention relates to a semiconductor apparatus and a method of manufacturing the same.

Description of the Related Art

In semiconductor apparatuses such as a solid-stage image sensing apparatus and a semiconductor memory device, noise or a leakage current due to an impurity such as a heavy metal or a crystal defect may be generated. Japanese Patent Laid-Open No. 2016-184624 discloses a technique of suppressing the emission of charges caused by an impurity by arranging a gettering region on the side face of an element isolation portion, thereby reducing noise.

In the technique disclosed in Japanese Patent Laid-Open No. 2016-184624, although it has an advantage by which a metal impurity can be gettered in a region near an element, a metal impurity may return near the element even in relatively low-temperature annealing. Accordingly, the temperature in the manufacturing process is limited, and this technique is susceptible to process variations. In addition, since the defect itself of the gettering region can become a noise generation source, the element design is limited. It may be difficult to sufficiently ensure the area of the element.

SUMMARY OF THE INVENTION

The present invention provides a technique advantageous in suppressing the generation of noise or a leakage current caused by an impurity such as a heavy metal and a crystal defect.

One of aspects of the present invention provides a method of manufacturing a semiconductor apparatus, comprising: forming a first trench on a side of a first face of a semiconductor substrate having the first face and a second face; forming a gettering region by implanting ions in the semiconductor substrate through the first trench; and forming a second trench on the side of the first face of the semiconductor substrate after the forming the gettering region, wherein a depth of a bottom surface of the second trench with reference to the first face is smaller than a depth of a bottom surface of the first trench with reference to the first face.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
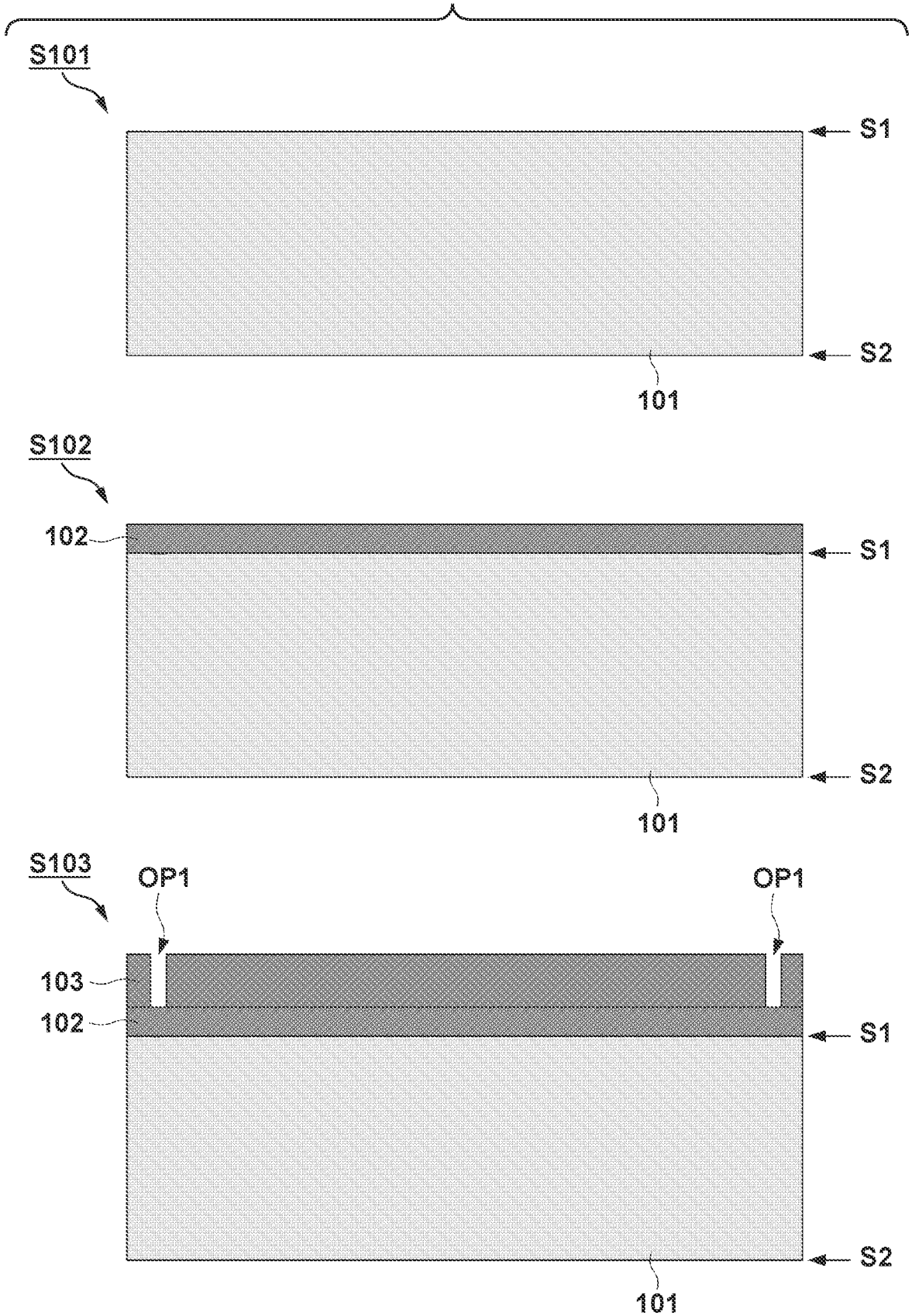
FIG. 1 shows views for explaining a method of manufacturing a photoelectric conversion apparatus according to the first embodiment of the present invention.
Figure 2:
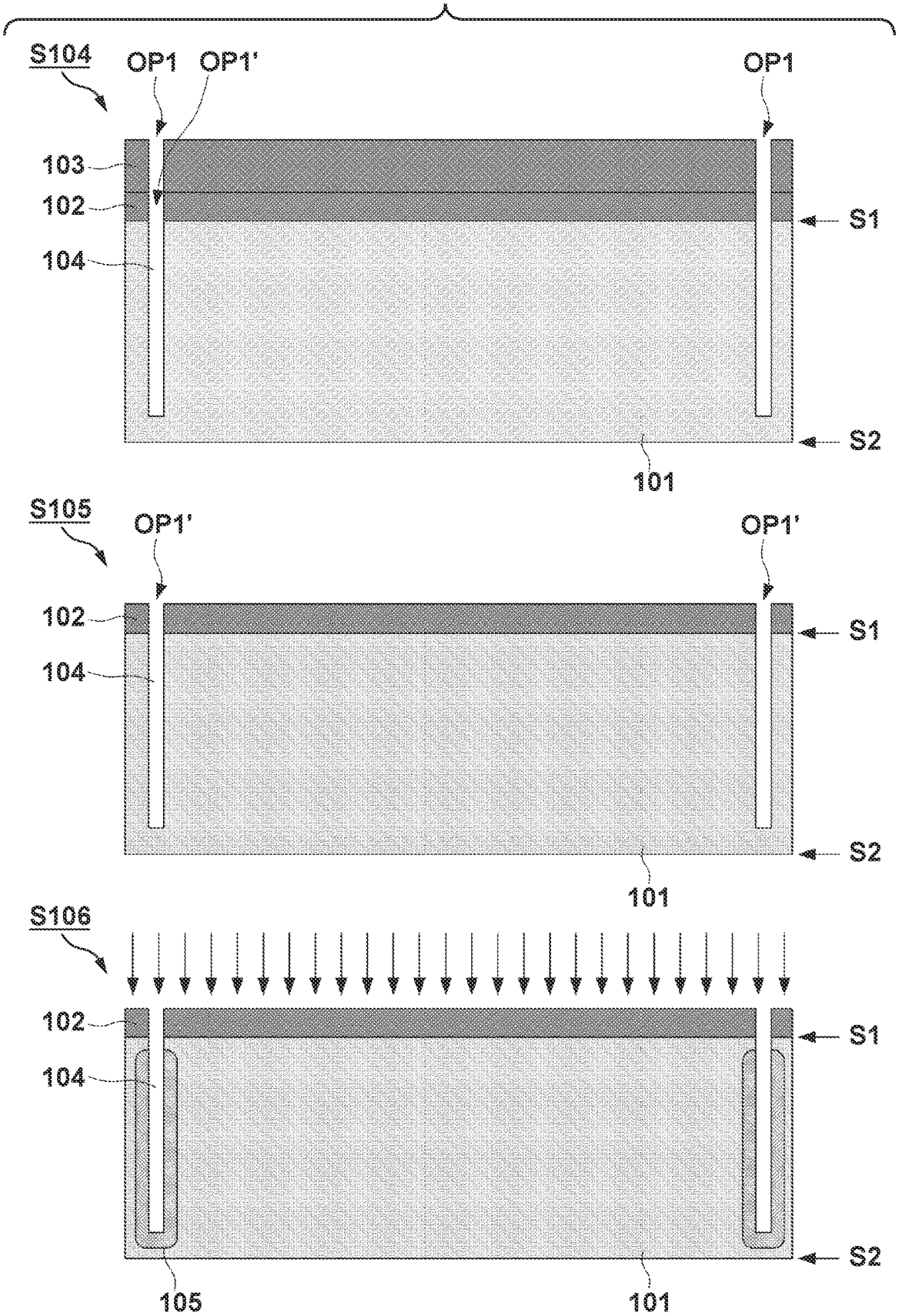
FIG. 2 shows views for explaining the method of manufacturing the photoelectric conversion apparatus according to the first embodiment of the present invention.
Figure 3:
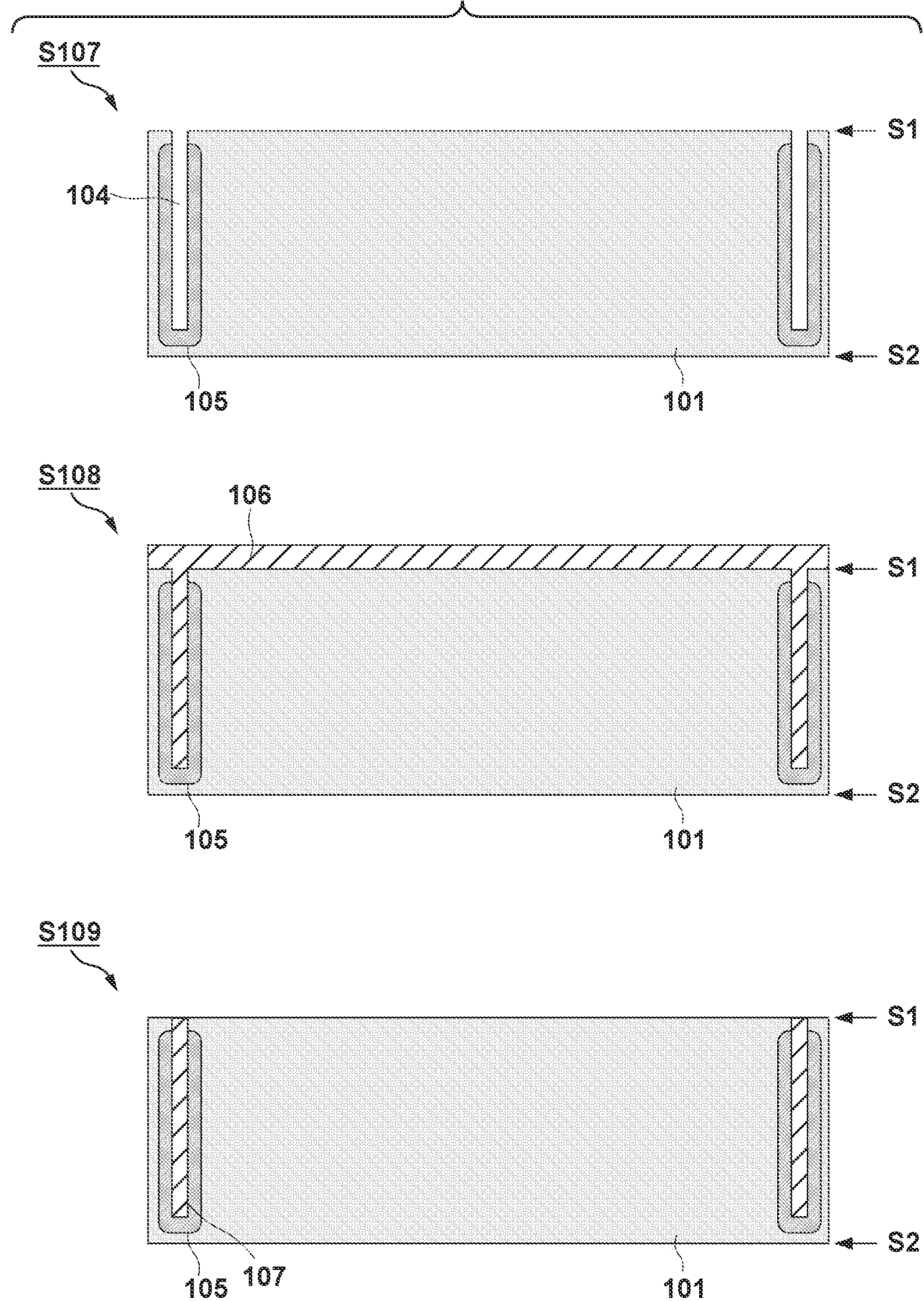
FIG. 3 shows views for explaining the method of manufacturing the photoelectric conversion apparatus according to the first embodiment of the present invention.
Figure 4:
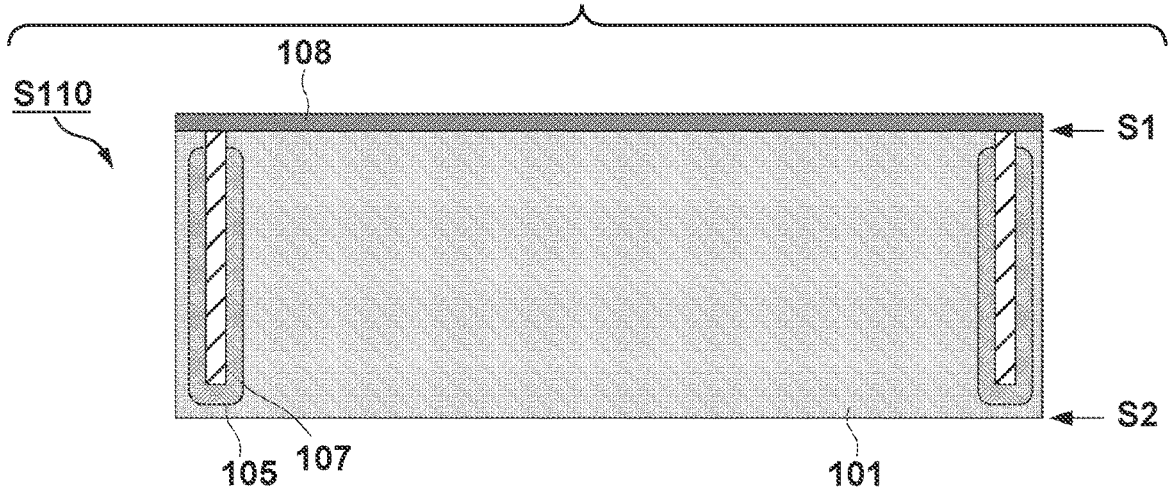
FIG. 4 shows views for explaining the method of manufacturing the photoelectric conversion apparatus according to the first embodiment of the present invention.
Figure 4:
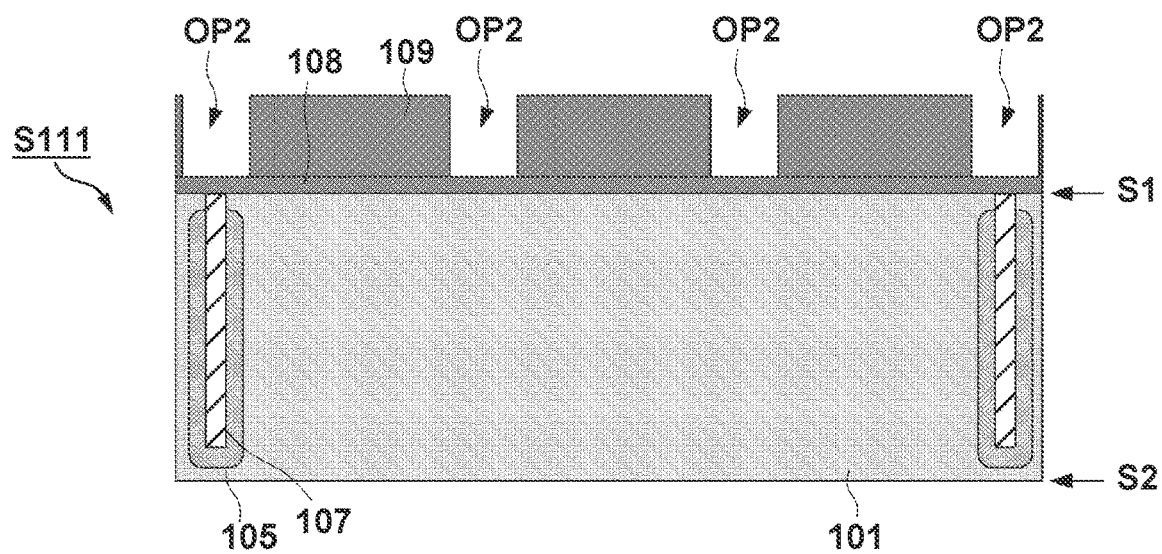
Figure 4:
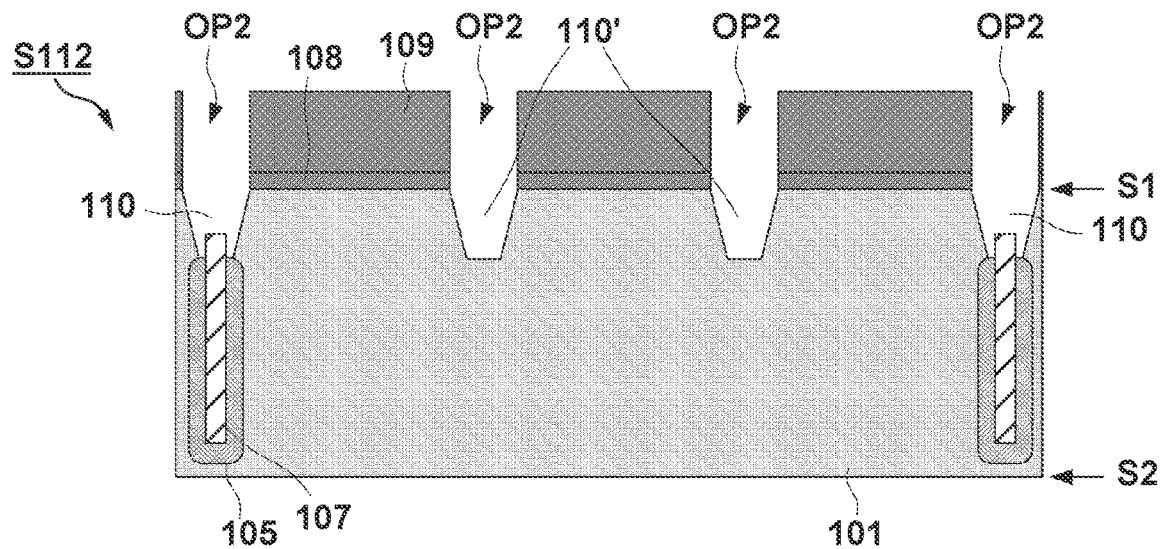
Figure 5:
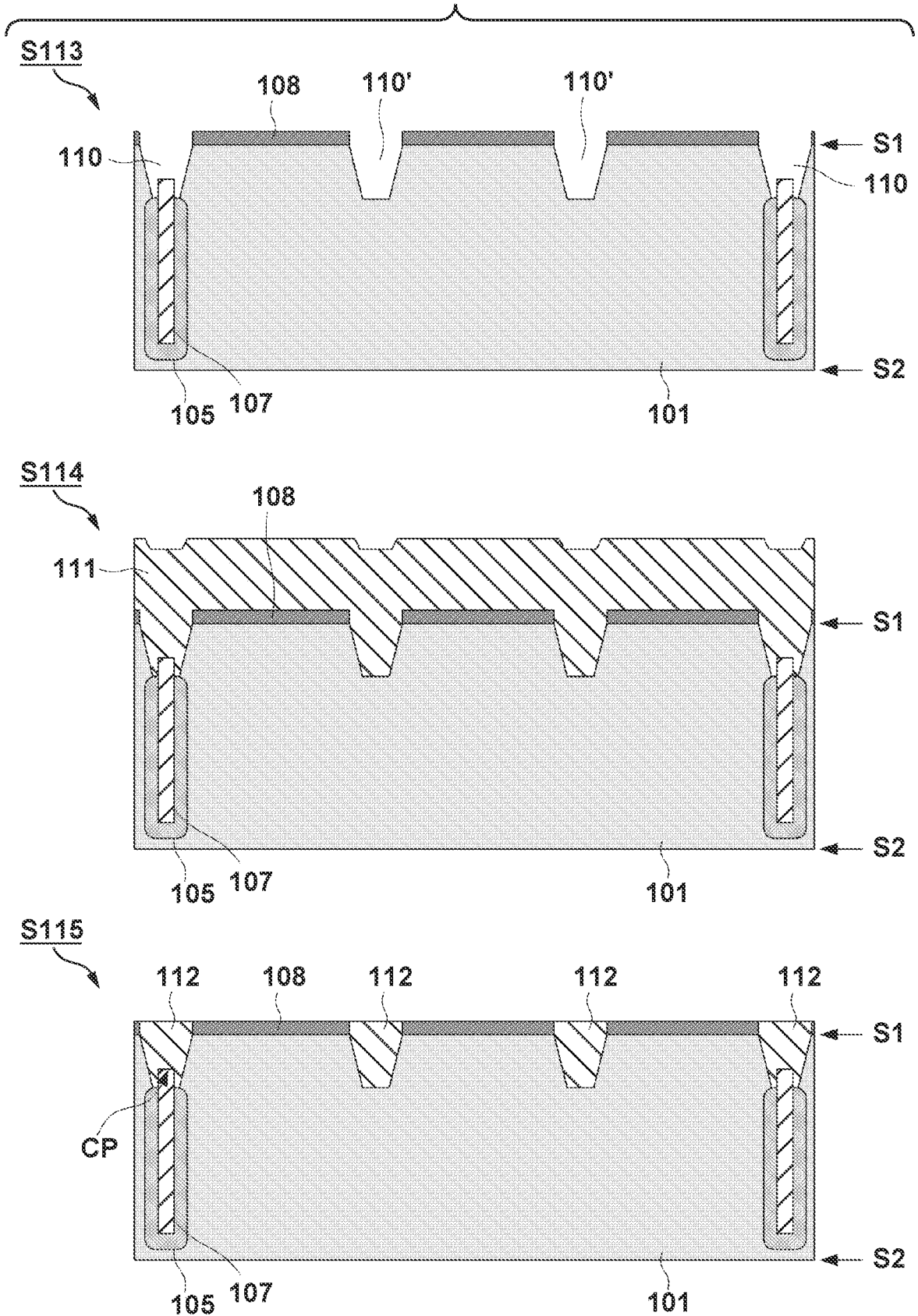
FIG. 5 shows views for explaining the method of manufacturing the photoelectric conversion apparatus according to the first embodiment of the present invention.
Figure 6:
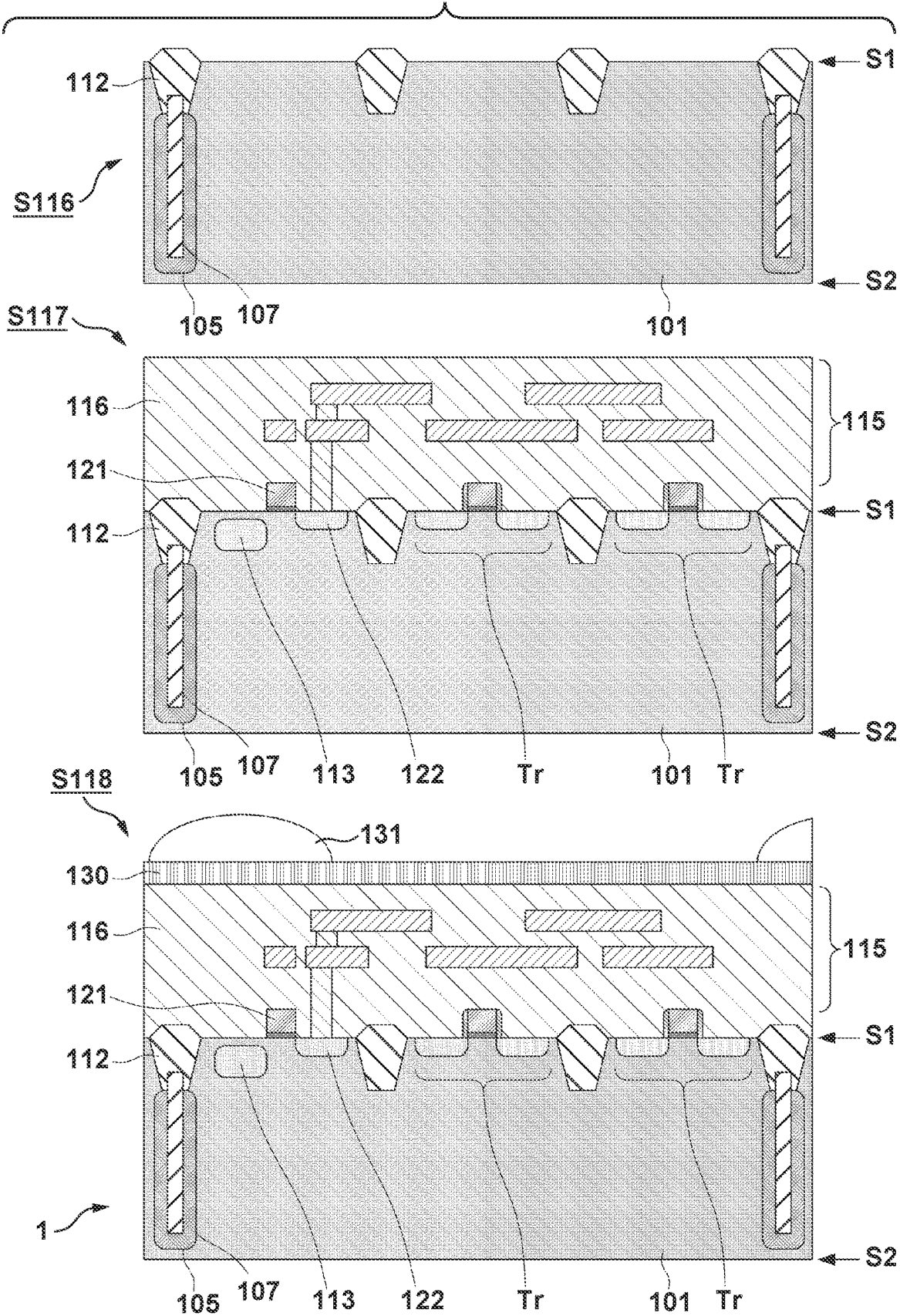
FIG. 6 shows views for explaining the method of manufacturing the photoelectric conversion apparatus according to the first embodiment of the present invention.
Figure 7:
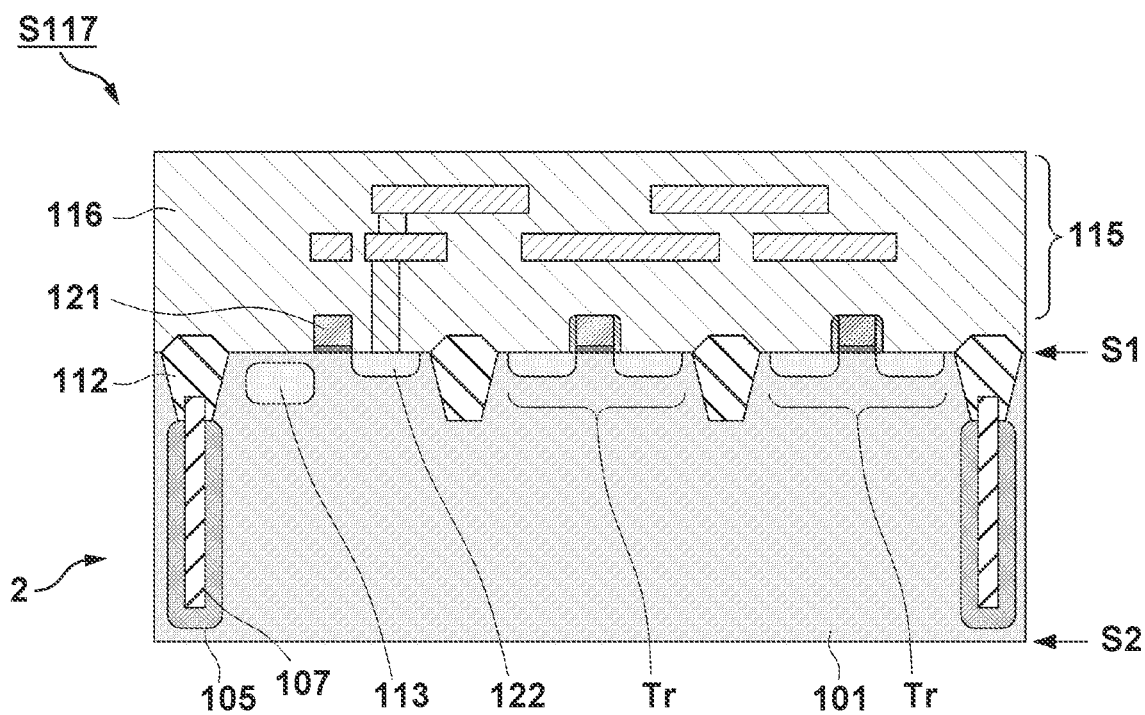
FIG. 7 shows views for explaining a method of manufacturing a photoelectric conversion apparatus according to the second embodiment of the present invention.
Figure 7:
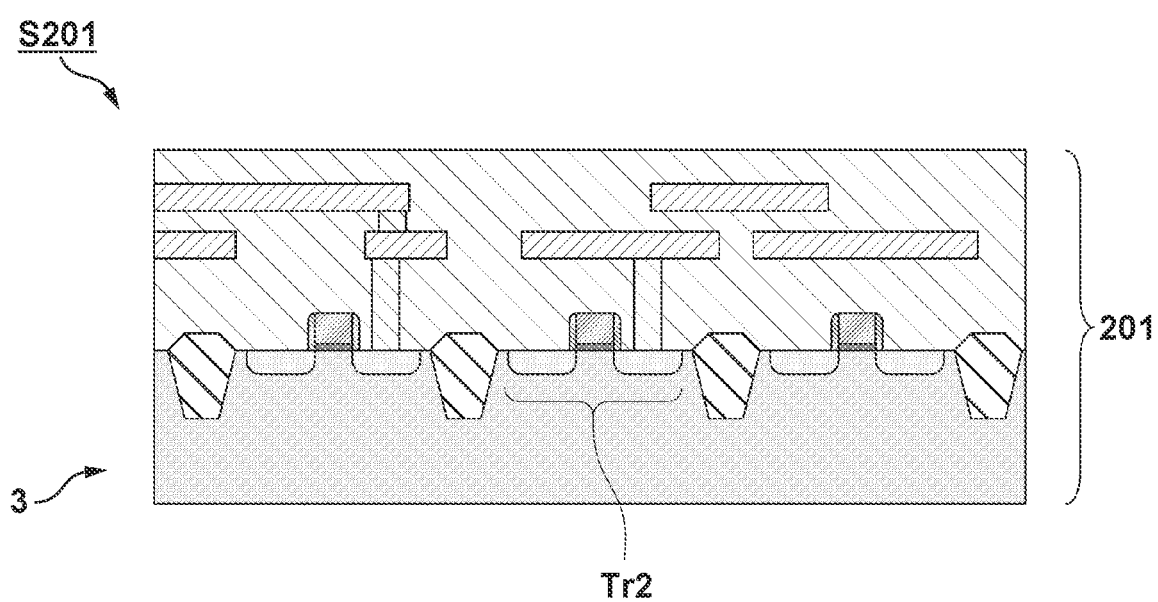
Figure 8:
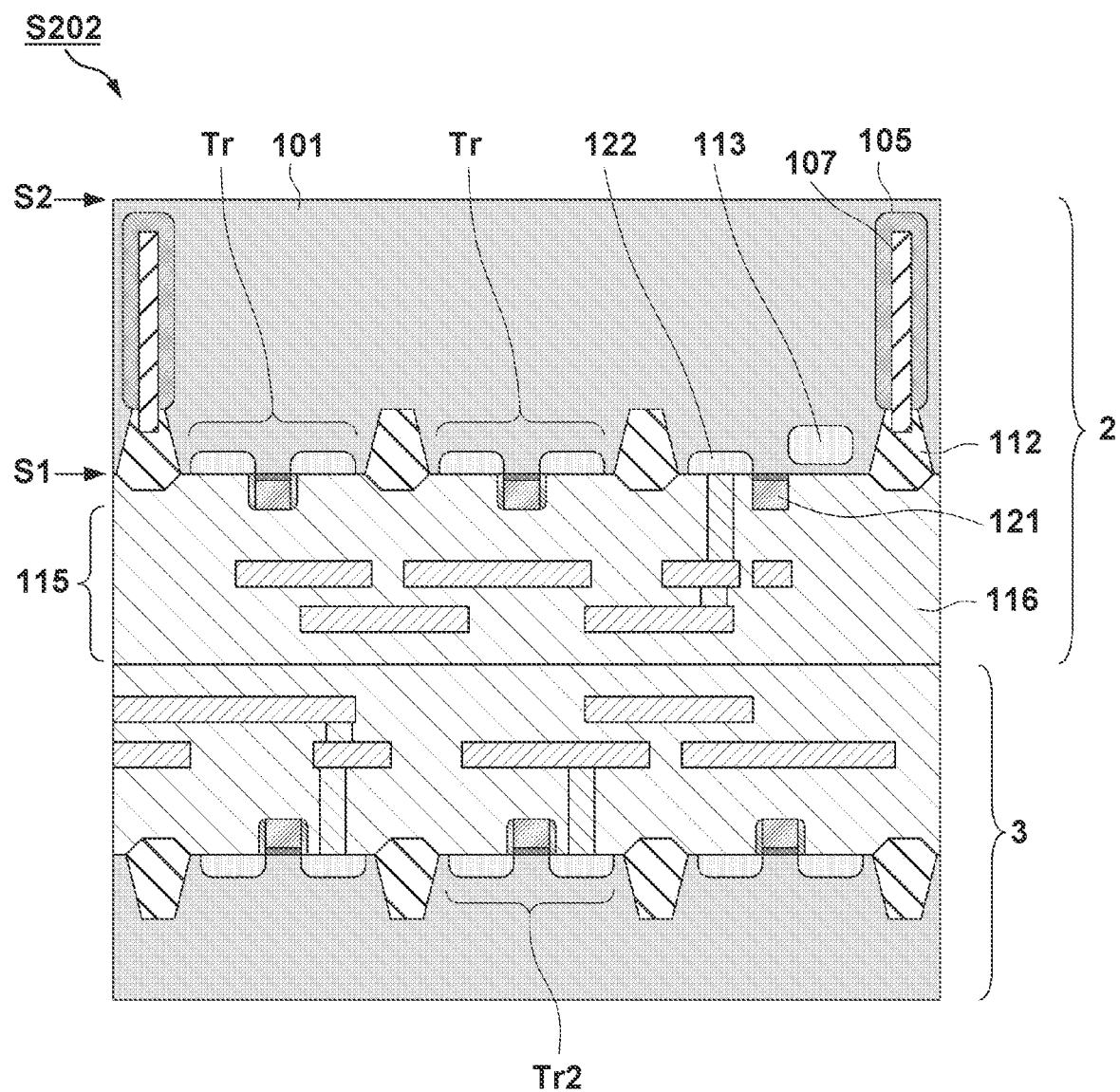
FIG. 8 is a view for explaining the method of manufacturing the photoelectric conversion apparatus according to the second embodiment of the present invention.
Figure 9:
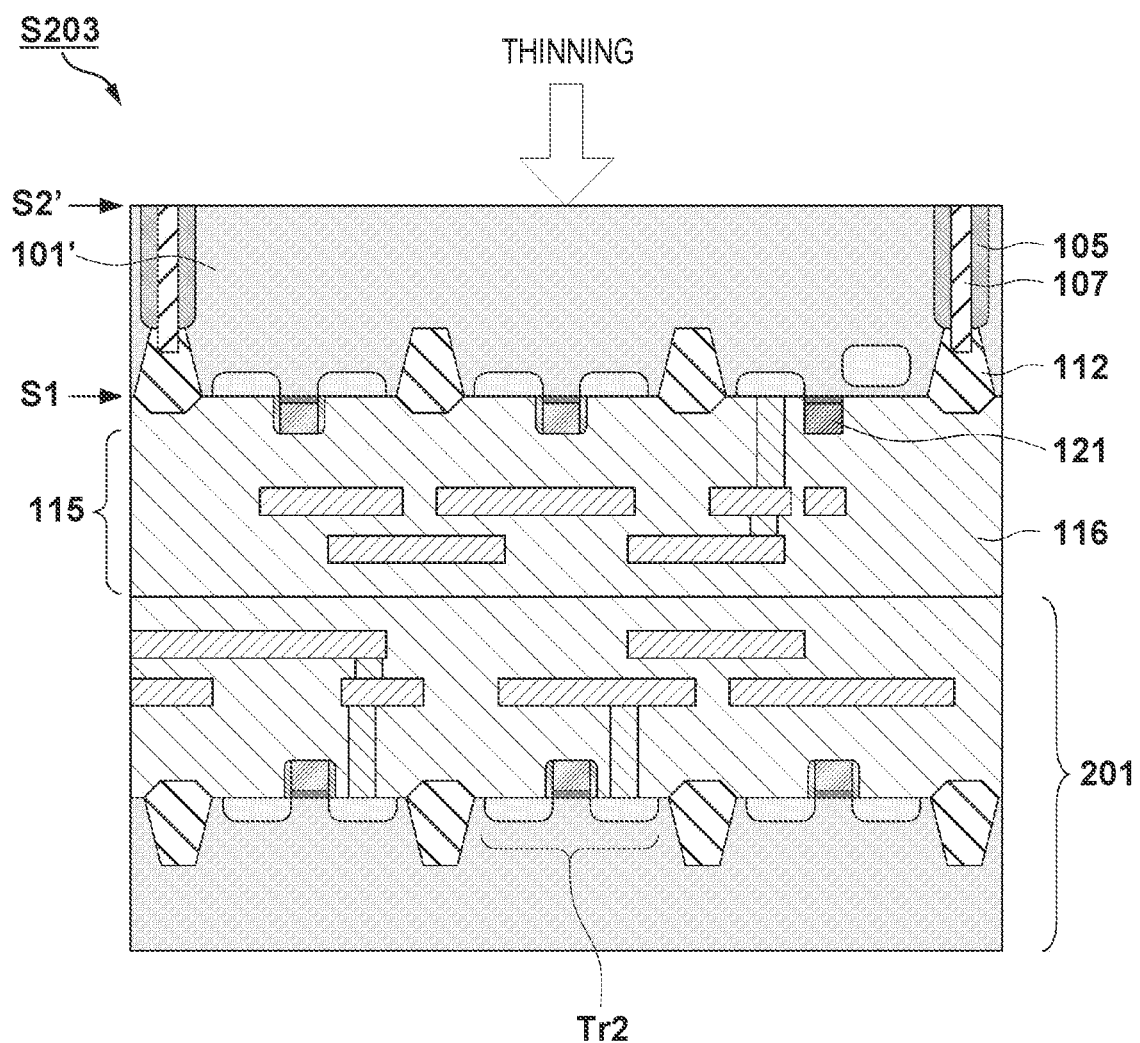
FIG. 9 is a view for explaining the method of manufacturing the photoelectric conversion apparatus according to the second embodiment of the present invention.
Figure 10:
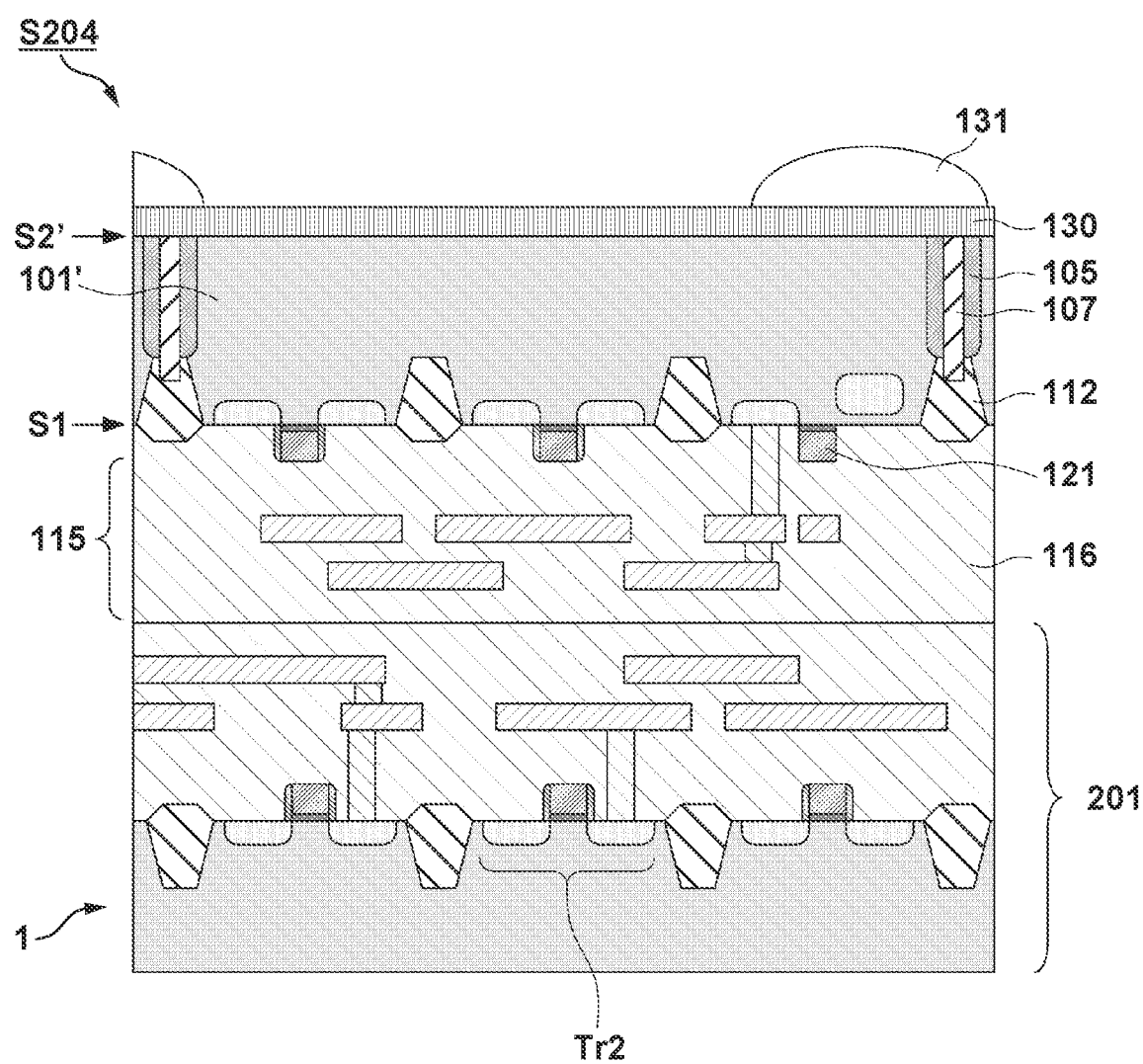
FIG. 10 is a view for explaining the method of manufacturing the photoelectric conversion apparatus according to the second embodiment of the present invention.

The present invention will be described using its exemplary embodiments with reference to the accompanying drawings. In the following description, a semiconductor apparatus according to the present invention is applied to a photoelectric conversion apparatus such as an image sensing apparatus. However, since one aspect of the present invention is characterized by element isolation and a gettering region, the present invention is applied to a semiconductor apparatus other than the photoelectric conversion apparatus. Examples of the semiconductor apparatus other than the photoelectric conversion apparatus are a memory device, an analog signal processor, and the like.

A photoelectric conversion apparatus such as an image sensing apparatus and its manufacturing method will be described as the first embodiment of a semiconductor apparatus of the present invention and its manufacturing method with reference to FIGS. 1 to 6. First, in step S101, a semiconductor substrate 101 having a first face S1 and a second face S2 which are opposing faces is prepared. The semiconductor substrate 101 is typically a silicon substrate or a silicon layer. Next, in step S102, an insulating film (for example, a silicon oxide film) 102 is formed on the first face S1 of the semiconductor substrate 101.

Next, in step S103, a first mask 103 having a first opening OP1 is formed on the first face S1 of the semiconductor substrate 101, more specifically on the insulating film 102 on the first face S1 of the semiconductor substrate 101. The first mask 103 can be formed, for example, by forming a photoresist film on the insulating film 102 and patterning the photoresist film by a lithography process such as a photolithography process or an imprint process.

Next, in step S104, the semiconductor substrate 101 is etched by a dry etching method through the first opening OP1 of the first mask 103, thereby forming a first trench 104 on the first face S1 side of the semiconductor substrate 101. In this case, the first opening OP1 of the first mask 103 can be transferred as a first transferred opening OP1' in the insulating film 102. The insulating film 102 in which the first transferred opening OP1' is formed can function as a hard mask for etching the semiconductor substrate 101. Step S102 for forming the insulating film 102 is an arbitrary step, and can be omitted if the first mask 103 has a sufficient etching resistance.

Next, in step S105, the first mask 103 is removed. Step S105 can be arbitrarily performed if the insulating film 102 having the first transferred opening OP1' is formed (if step S102 is performed). If the insulating film 102 having the first transferred opening OP1' is formed (if step S102 is performed), step S105 need not be performed.

Next, in step S106, the insulating film 102 having the first transferred opening OP1' is used as a hard mask (an ion implantation mask), and ions are implanted into the semiconductor substrate 101 through the first transferred opening OP1' and the first trench 104, thereby forming a gettering region 105. That is, in step S106, ions are implanted into the semiconductor substrate 101 through the first trench 104 in a state in which a region other than a region having the first trench 104 is masked. The gettering region 105 can include a first portion positioned below the bottom of the first trench 104 and a second portion positioned on the lateral side of the first trench 104. As an example, the group 14 element concentration in the first portion is higher than that in the second portion. If the semiconductor substrate 101 is a silicon substrate, the ions can be the group 14 element ions other than silicon. An ion implantation apparatus can be used for implanting ions. An acceleration energy for implanting the ions can be determined such that the ions are not implanted through the insulating film 102 serving as the hard mask and does not reach the semiconductor substrate 101. For example, if the thickness of the insulating film 102 is 300 nm and the acceleration energy is about 20 keV in implanting the ions, the ions are not implanted through the insulating film 102.

If the semiconductor substrate 101 is made of a silicon substrate, a material that forms ions to be implanted into the semiconductor substrate 101 in step S106 is preferably carbon. A hydrocarbon molecule containing carbon may be employed. If the semiconductor substrate 101 is made of the silicon substrate, a material that forms ions to be implanted into the semiconductor substrate 101 in step S106 can be germanium, tin, or lead. If carbon, germanium, tin, or lead ions are implanted in the silicon substrate serving as the semiconductor substrate 101, a local strain is given to the silicon substrate and this local region functions as a gettering site. By implanting the ions into the semiconductor substrate 101 through the first trench 104, the gettering region 105 can be formed at a deep position of the semiconductor substrate 101 even with a relatively low acceleration energy.

If the insulating film 102 is not formed (if step S102 is not performed), step S105 is not performed. In step S106, ions can be implanted into the semiconductor substrate 101 using the first mask 103 as the ion implantation mask, and the gettering region 105 can be formed.

Next, in step S107, the insulating film 102 can be removed. Subsequently, in step S108, an insulating film (for example, a silicon nitride film) 106 is formed in the first trench 104 and on the first face S1 of the semiconductor substrate 101 by a film formation method such as a reduced pressure CVD method so as to arrange or fill the insulator in the first trench 104. Subsequently, in step S109, a portion of the insulating film 106 which exits on the first face S1 of the semiconductor substrate 101 is removed by a CMP method or the like. Accordingly, a portion of the insulating film 106 which exists in the first trench 104 is left as a first separation member (first element isolation) 107 arranged or filled in the first trench 104. Note that steps S108 and S109 need not be performed. If steps S108 and S109 are not performed, the first trench 104 is left as an air gap which can function as the first element isolation. The first separation member 107 arranged in the first trench 104 need not be perfectly filled in the first trench 104, and an air gap may exist in the first trench 104. The first separation member 107 can be formed from only an insulator, but can be formed by a combination of an insulator and a non-insulator (a semiconductor or conductor). In this case, in order to avoid the contact between the non-insulator and the semiconductor substrate 101, the insulator can be arranged between the non-insulator and the semiconductor substrate 101.

Next, in step S110, an insulating film (for example, a silicon nitride film) 108 is formed on the first face S1 of the semiconductor substrate 101. Subsequently, in step S111, a second mask 109 having second openings OP2 is formed on the first face S1 of the semiconductor substrate 101, more specifically, on the insulating film 108 on the first face S1 of the semiconductor substrate 101. The second mask 109 can be formed, for example, by forming a photoresist film on the insulating film 108 and patterning the photoresist film by a lithography process such as a photolithography process or an imprint process.

Next, in step S112, a plurality of trenches are formed on the first face S1 side of the semiconductor substrate 101 by etching the semiconductor substrate 101 through the second openings OP2 of the second mask 109. The plurality of trenches can include a second trench 110 formed on the first separation member 107 so as to expose the first separation member (first element isolation) 107. In addition, the plurality of trenches can include a third trench 110' formed in a region where the first separation member 107 does not exist, in addition to the second trench 110 formed on the first separation member 107.

In step S112, when forming the second trench 110, part of the first separation member 107 and part of the semiconductor substrate 101 can be removed. Alternatively, in step S112, when forming the second trench 110, part of the gettering region 105, part of the first separation member 107, and part of the semiconductor substrate 101 can be removed. Alternatively, in step S112, when forming the second trench 110, part of the gettering region 105 can be removed. The part is a portion present at a position near a charge accumulation region 113 to be formed later. The removal of the part can function to prevent the movement to the charge accumulation region 113 and its vicinity by re-diffusion of a metal element gettered by the part.

In step S112, the second trench 110 is formed such that an upper portion (end portion) of the first separation member (first element isolation) 107 protrudes from the bottom surface of the second trench 110. This can be achieved by an etching selectivity between the semiconductor substrate 101 and the first separation member 107. That is, step S112 is performed under the condition that the etching rate of the semiconductor substrate 101 is higher than that of the first separation member (first element isolation) 107.

Next, in step S113, the second mask 109 is removed. Subsequently, in step S114, an insulating film (for example, a silicon oxide film) 111 is formed in the second trench 110 and on the insulating film 108 by a film formation method such as a high-density plasma CVD method so as to arrange or fill the insulator in the second trench 110. In this case, the insulating film 111 can be made of a material different from that of the insulating film 108. Before step S114, a channel stopper impurity may be implanted in the semiconductor substrate 101 through the second trench 110.

Next, in step S115, a portion of the insulating film 111 which exists on the insulating film 108 is removed by a CMP method or the like. At this time, the insulating film 108 can be used as a polishing stopper film. Accordingly, a portion of the insulating film 111 which exists in the second trench 110 and the third trench 110' is left as a second separation member (second element isolation) 112 in which the second trench 110 is arranged and filled. The second separation member (second element isolation) 112 includes a portion arranged between the first separation member (first element isolation) 107 and the first face S1. The second separation member 112 can be arranged in contact with at least one of the first separation member 107 and the gettering region 105. In addition, the second separation member 112 can be arranged in contact with the gettering region 105. The second separation member 112 arranged in the second trench 110 need not be perfectly filled in the trench 112, but an air gap may exist in the second trench 110. The second separation member 112 can be formed from only an insulator, but can be formed by a combination of an insulator and a non-insulator (a semiconductor or conductor). In this case, in order to avoid the contact between the non-insulator and the semiconductor substrate 101, the insulator can be arranged between the non-insulator and the semiconductor substrate 101. The end face (upper face) of the gettering region 105 on the first face S1 side can be positioned in the semiconductor substrate 101. In other words, the end face (upper face) of the gettering region 105 on the first face S1 side is positioned between the first face S1 and the second face S2 so as not to contact the first face S1.

In step S112, when the second trench 110 is formed such that the upper portion (end portion) of the first separation member (first element isolation) 107 protrudes from the bottom surface of the second trench 110, a concave portion CP can be formed at the lower end of the second separation member 112 filled in the second trench 110. In this case, the second separation member 112 can be arranged such that the upper portion (end portion) of the first separation member 107 is fitted in the concave portion CP.

Next, in step S116, the insulating film 108 is removed. Subsequently, in step S117, a transfer gate (gate electrode) 121, the charge accumulation region 113, a floating diffusion 122, transistors Tr, a wiring layer 115, an interlayer dielectric film 116, and the like can be formed. Subsequently, in step S118, members 130 including a light-shielding layer, a planarization layer, a passivation layer, a color filter layer, and the like, and further a microlens 131 can be formed on the interlayer dielectric film 116. The charge accumulation region 113 forms part of the photoelectric conversion element. The depth of the end face of the charge accumulation region 113 on the second face S2 with reference to the first face S1 is preferably smaller than the depth of the second trench 110 with reference to the first face S1. This arrangement is effective to make an element such as the charge accumulation region 113 and the gettering region 105 be spaced apart from each other.

Light entering the photoelectric conversion element generates electrons and holes. The charges of either electrons or holes can be accumulated in the charge accumulation region 113 and transferred to the floating diffusion 122 through the channel formed under the transfer gate 121. A readout circuit formed from the plurality of transistors Tr reads out a signal corresponding to the charges transferred to floating diffusion 122.

A photoelectric conversion apparatus 1 (semiconductor apparatus) thus obtained is a front irradiation type photoelectric conversion apparatus. The depth (the depth of the end face of the second separation member 112 on the second face S2 side) of the bottom surface of the second trench 110 with reference to the first face S1 is smaller than the depth (the depth of the end face of the first separation member 107 on the second face S2 side) of the bottom surface of the first trench 104 with reference to the first face S1. In the photoelectric conversion apparatus 1, the gettering region 105 can be positioned between the charge accumulation region 113 and the first trench 104.

The depth of the bottom surface of the first trench 104 with reference to the first face S1 (the depth of the end face of the first separation member 107 on the second face S2 side) is preferably 0.5 μm or more, and more preferably 1 μm or more. From another point of view, the first trench 104 and the first separation member 107 preferably include a portion whose depth with reference to the first face S1 is 0.5 μm or more and more preferably include a portion whose depth with reference to the first face S1 is 1 μm or more. The gettering region 105 can include a lateral region of the bottom surface of the first trench 104. Alternatively, the depth of the gettering region 105 with reference to the first face S1 preferably includes a portion whose depth with reference to the first face S1 is 0.5 μm or more, and more preferably includes a portion whose depth with reference to the first face S1 is 1 μm or more.

A photoelectric conversion apparatus such as an image sensing apparatus and its manufacturing method will be described as the second embodiment of a semiconductor apparatus of the present invention and its manufacturing method with reference to FIGS. 7 to 10. According to the second embodiment, a first structure 2 having a photoelectric conversion unit including a charge accumulation region 113 is formed in accordance with steps S101 to S117 of the first embodiment. In addition, in the second embodiment, a second structure 3 is formed in step S201. The second structure 3 is a structure including a circuit such as transistors Tr2, but may be a support substrate not including circuits. The circuits include a logic circuit and/or a memory circuit.

After the first structure 2 and the second structure 3 are prepared, the first structure 2 and the second structure 3 are bonded such that the second structure 3 is bonded to a wiring layer 115 of the first structure 2 so as to expose a second face S2 of the first structure 2 in step S202. Accordingly, a bonded structure made of the first structure 2 and the second structure 3 is obtained. The bonding is achieved such that a silicon oxide film is formed on an interlayer dielectric film 116 of the first structure 2 or the exposed surface of the interlayer dielectric film 116 is made of a silicon oxide film, the bonding surface of the second structure 3 is made of a silicon oxide film, and the silicon oxide films are bonded. Alternatively, the first structure 2 and the second structure 3 may be bonded to each other by a contact agent or another method.

Next, in step S203, part of a semiconductor substrate 101 in the bonded structure on the second face S2 side is removed to thin the semiconductor substrate 101. The thinned semiconductor substrate 101 has a first face S1 and a second face S2' which oppose each other. The semiconductor substrate 101 is preferably thinned such that part of a gettering region 105 is removed. Alternatively, the semiconductor substrate 101 can be thinned such that a first separation member 107 is exposed or part of the first separation member 107 is removed. When the semiconductor substrate 101 is thinned such that the first separation member 107 is exposed or part of the first separation member 107 is removed, the part of the gettering region 105 can be removed. In a region of the gettering region 105 near the bottom surface of the first separation member 107, a large amount of gettering element introduced by ion implantation is large, and the number of crystal defects is also large, so that an amount of gettered metal impurity is large. For this reason, the semiconductor substrate 101 is thinned such that a region near the bottom of the first separation member 107 is removed, thereby effectively removing the gettered metal impurity. A portion of the gettering region 105 which is positioned on the lateral side of a first trench 104 can reach the second face S2'.

In step S107, the depth of the bottom surface of the first trench 104 with reference to the first face S1 is determined in consideration of the removal amount of the semiconductor substrate 101 in thinning of the semiconductor substrate 101. The semiconductor substrate 101 can be thinned by, for example, polishing using a grinder or CMP. In addition, a known substrate thinning technique employed in three-dimensional mounting or a TSV (Through-Silicon Via) formation process may be applied.

Next, in step S204, members 130 including a light-shielding layer, a planarization layer, a passivation layer, a color filter layer, and the like, and further a microlens 131 can be formed on the second face S2'. The gettering region 105 and the first separation member 107 can contact the members 130. The members 130 can include a dielectric film contacting the second face S2. The first separation member 107 and the gettering region 105 can contact this dielectric film. This dielectric film can be a silicon compound film such as a silicon oxide film or a silicon nitride film, or a metal oxide film such as an aluminum oxide film or a hafnium oxide film. The metal oxide film can reduce a dark current by fixing the charges in the semiconductor substrate 101. As described above, a back irradiation type photoelectric conversion apparatus 1 (semiconductor apparatus) can be obtained.

The photoelectric conversion apparatus and its manufacturing method according to each of the first and second embodiments are advantageous in suppressing noise and a leakage current caused by an impurity such as a heavy metal and a crystal defect.

An electronic device such as a camera or smartphone or a transportation apparatus such as an automobile in which the photoelectric conversion apparatus 1 is incorporated as an image sensing apparatus will be described as an application example of the photoelectric conversion apparatus 1 of each of the above embodiments. In this case, the concept of the camera includes not only an apparatus of imaging as the main purpose but also an apparatus (for example, a personal computer and a portable terminal such as a tablet) having an auxiliary imaging function.

Figure 11:
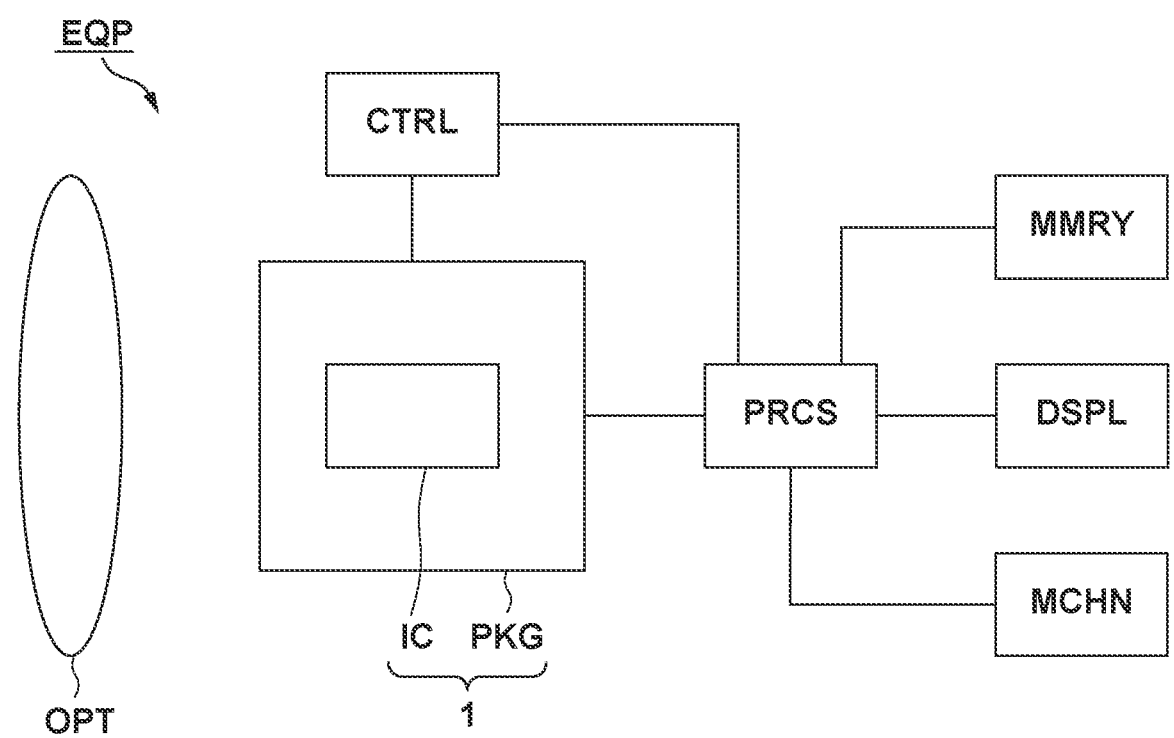
FIG. 11 is a schematic view of a device equipped with the photoelectric conversion apparatus.

FIG. 11 is a schematic view of a device EQP incorporating a photoelectric conversion apparatus 1. An example of the equipment EQP is an electronic device (information device) such as a camera or smartphone or a transportation apparatus such as an automobile or airplane. The photoelectric conversion apparatus 1 can include a package PKG configured to store a semiconductor device IC in addition to the semiconductor device IC including a semiconductor substrate (semiconductor chip). The package PKG can include a base on which the semiconductor device IC is fixed, a lid made of glass facing the semiconductor device IC, and connection members such as bonding wires and bumps for connecting terminals of the base and the terminals of the semiconductor device IC. The device EQP further includes at least one of an optical system OPT, a controller CTRL, a processor PRCS, a display device DSPL, and a storage device MMRY. The optical system OPT is a system for forming an optical image on the photoelectric conversion apparatus 1 and is made of, for example, a lens, a shutter, and a mirror. The controller CTRL controls an operation of the photoelectric conversion apparatus 1 and is a semiconductor device such as an ASIC. The processor PRCS processes a signal output from the photoelectric conversion apparatus 1 and is a semiconductor device such as a CPU or ASIC forming an AFE (Analog Front End) or a DFE (Digital Front End). The display device DSPL includes an EL display device or liquid crystal display device configured to display information (image) obtained by the photoelectric conversion apparatus 1. The storage device MMRY is a magnetic device or semiconductor device configured to store information (image) obtained by the photoelectric conversion apparatus 1. The storage device MMRY is a volatile memory such as an SRAM or DRAM or a nonvolatile memory such as a flash memory or hard disk drive. A machine apparatus MCHN includes a moving or propulsion mechanism such as a motor or engine. The machine apparatus MCHN in the camera can drive the components of the optical system OPT in order to perform zooming, an in-focus operation, and a shutter operation. The device EQP displays the signal output from the photoelectric conversion apparatus 1 on the display device DSPL and performs external transmission by a communication device (not shown) of the device EQP. For this purpose, the device EQP may further include the storage device MMRY and the processor PRCS in addition to the memory circuits and arithmetic circuits included in the control/signal processing circuits in which the photoelectric conversion apparatus 1 is incorporated.

Figure 12A:
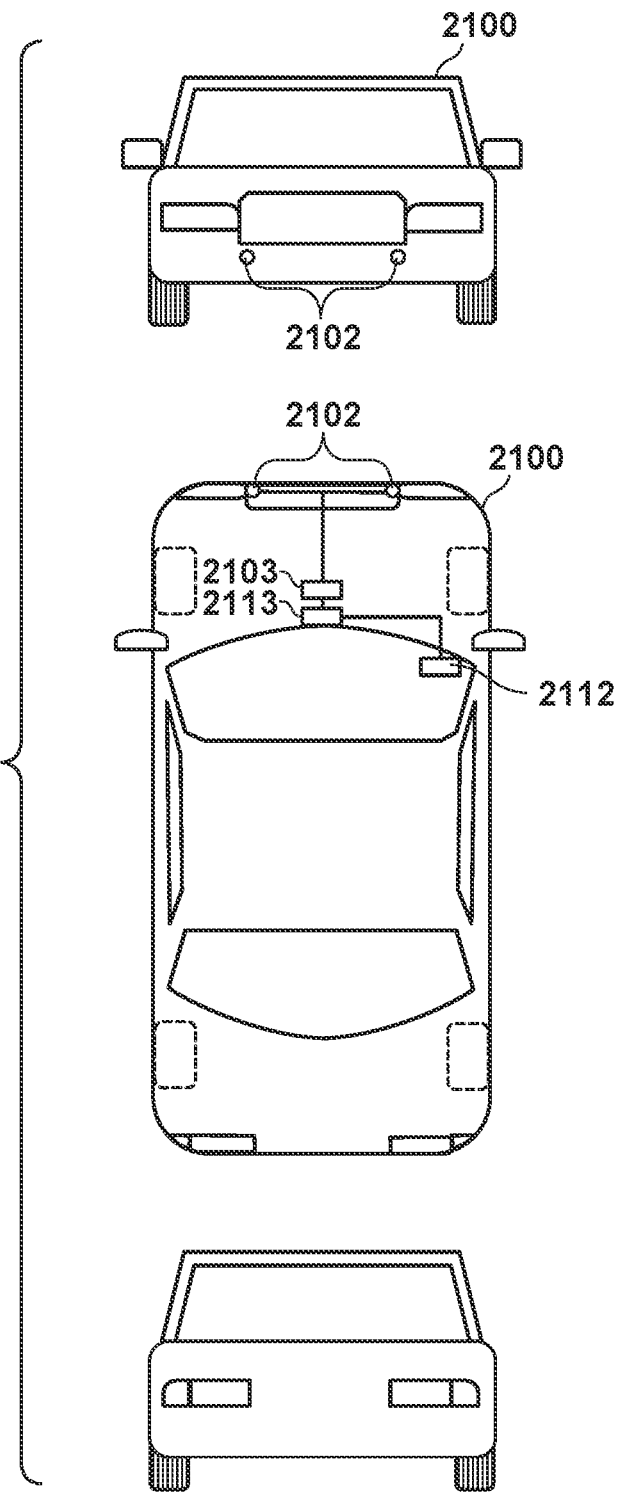
FIGS. 12A and 12B are schematic views of another device equipped with the photoelectric conversion apparatus.

As described above, the photoelectric conversion apparatus 1 according to each of the first and second embodiments is advantageous in suppressing noise and a leakage current. A camera in which the photoelectric conversion apparatus 1 is incorporated is suitable as an onboard camera mounted in the transportation apparatus such as an automobile or railroad train. An example in which a camera incorporating the photoelectric conversion apparatus 1 is applied to the transportation apparatus will be explained. A transportation apparatus 2100 is an automobile including an onboard camera 2101 shown in, for example, FIGS. 12A and 12B. FIG. 12A schematically shows the outer appearance and the main internal structure of the transportation device 2100. The transportation apparatus 2100 includes photoelectric conversion apparatuses 2102, an image sensing system integrated circuit (ASIC: Application Specific Integrated Circuit) 2103, an alarming device 2112, and a controller 2113.

The photoelectric conversion apparatuses 1 are used as the photoelectric conversion apparatuses 2102. Upon reception of an abnormality signal from an image sensing system, vehicle sensors, or the control unit, the alarming device 2112 outputs an alarm to a driver. The controller 2113 comprehensively controls the operations of the image sensing system, the vehicle sensors, and the control unit. Note that the transportation apparatus 2100 need not comprise the controller 2113. In this case, the image sensing system, the vehicle sensors, and the control unit have individual communication interfaces which exchange control signals via a communication network (for example, the CAN standard).

Figure 12B:
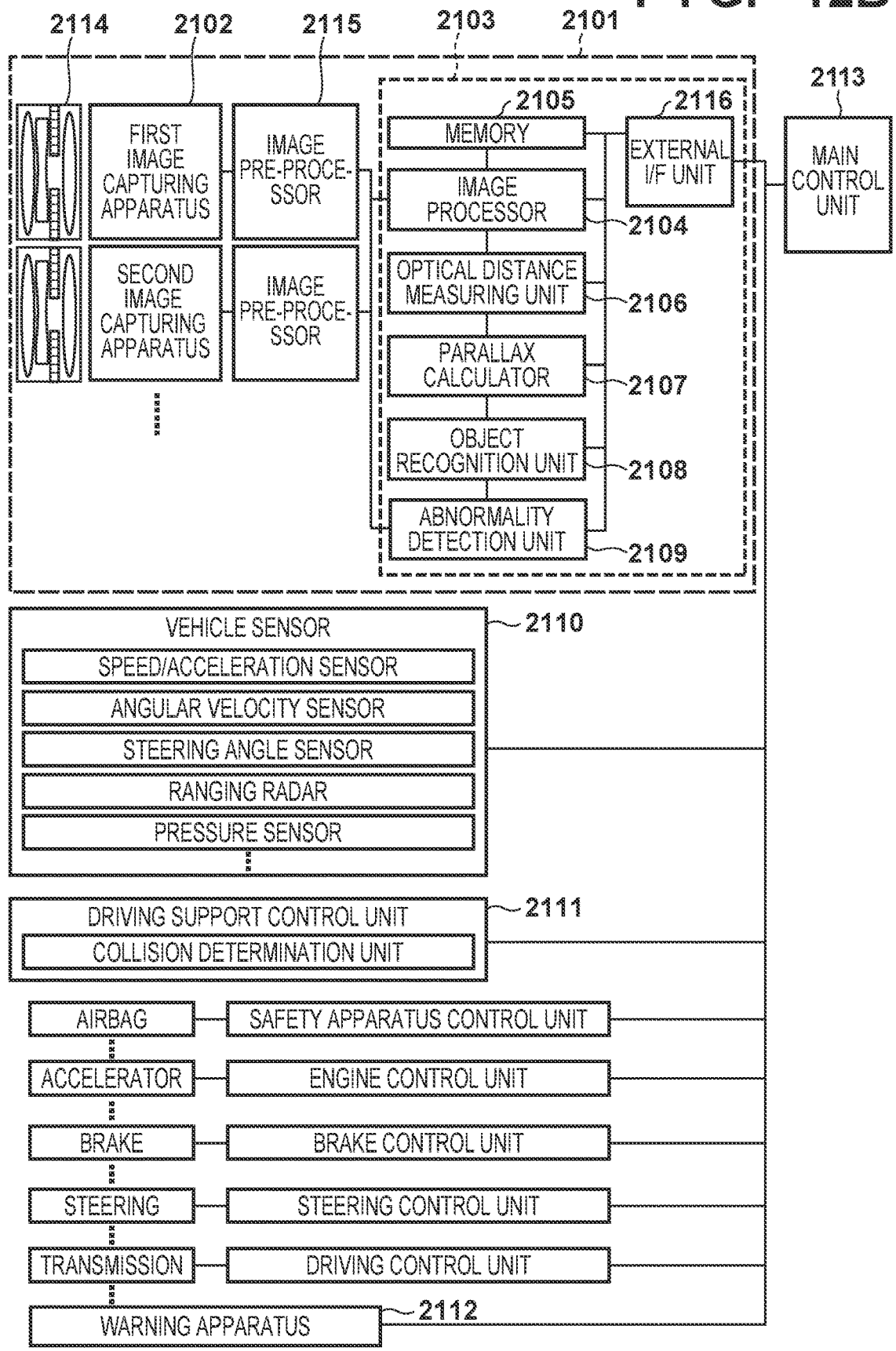

FIG. 12B is a block diagram showing the system arrangement of the transportation apparatus 2100. The transportation apparatus 2100 includes a first photoelectric conversion apparatus 2102 and a second photoelectric conversion apparatus 2102. That is, the onboard camera of this embodiment is a stereo camera. An object image is focused on each photoelectric conversion apparatus 2102 by an optical unit 2114. A pixel signal output from each photoelectric conversion apparatus 2102 is processed by an image preprocessor 2115 and is transmitted to the image sensing system integrated circuit 2103. The image preprocessor 2115 performs S-N calculation, sync signal addition, and the like. A signal processor 902 corresponds to at least part of the image preprocessor 2115 and the image sensing system integrated circuit 2103.

The image sensing system integrated circuit 2103 includes an image processor 2104, a memory 2105, an optical distance measurement unit 2106, a parallax calculation unit 2107, an object recognition unit 2108, an abnormality detection unit 2109, and an external interface (I/F) unit 2116. The image processor 2104 processes signals output from the respective pixels of each photoelectric conversion apparatus 2102 and generates an image signal. The image processor 2104 performs correction of the image signal and complementation of an abnormal pixel. The memory 2105 temporarily holds the image signal. In addition, the memory 2105 may store the position of the abnormal pixel of the known photoelectric conversion apparatus 2102. The optical distance measurement unit 2106 performs the in-focus operation and distance measurement of the object using the image signal. The parallax calculation unit 2107 performs object collation (stereo matching) of a parallax image. The object recognition unit 2108 analyzes the image signal and recognizes the object such as the transportation apparatus, a person, a sign, or a road. The abnormality detection unit 2109 detects the failure or operation error of each photoelectric conversion apparatus 2102. If the abnormality detection unit 2109 detects a failure or operation error, it sends a signal indicating that the abnormality is detected to the controller 2113. The external I/F unit 2116 interfaces information exchange between each unit of the image sensing system integrated circuit 2103 and the controller 2113 or various kinds of control units.

The transportation apparatus 2100 includes a vehicle information acquisition unit 2110 and a driving support unit 2111. The vehicle information acquisition unit 2110 includes vehicle sensors such as a speed/acceleration sensor, an angular velocity sensor, a steering sensor, a distance measuring radar, and a pressure sensor.

The driving support unit 2111 includes a collision determination unit. The collision determination unit determines based on information from the optical distance measurement unit 2106, the parallax calculation unit 2107, and the object recognition unit 2108 whether a collision with an object is possible. The optical distance measurement unit 2106 and the parallax calculation unit 2107 are examples of distance information acquisition means for acquiring distance information to the object. That is, the distance information is information about a parallax, a defocus amount, a distance to an object, and the like. The collision determination unit determines the collision possibility using any one of pieces of distance information. The distance information acquisition means may be implemented by dedicated design hardware or a software module.

An example in which the transportation apparatus 2100 is controlled by the driving support unit 2111 so as not to collide with another object has been described above. The present invention is also applicable to automated driving control for causing a self-vehicle to follow another vehicle and automated driving control in which the self-vehicle does not stray onto the next lane.

The transportation apparatus 2100 includes driving apparatuses such as airbags, accelerator pedal, a brake pedal, a steering wheel, a transmission, an engine, a motor, wheels, a propeller, and the like, which are used to move the vehicle or used to help the movement. Also, the transportation apparatus 2100 includes these control units. The control unit controls the corresponding driving apparatus based on a control signal from the controller 2113.

The applications of the image sensing system used in this embodiment are not limited to automobiles and railroad vehicles, but the image sensor system can be used for a transportation apparatus such as a ship, an airplane, or an industrial robot. In addition, the present invention is not limited to the transportation apparatus but is also applicable to an apparatus such as an ITS (Intelligence Transportation System) which uses broad object recognition.

The above embodiments have been made to exemplify several modes to which the present invention is applied. Various changes and modification can appropriately be made without departing from the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-015507, filed Jan. 31, 2018, which is hereby incorporated by reference herein in its entirety.

What is claimed is:

1. A method of manufacturing a semiconductor apparatus, comprising:
   forming a first trench on a side of a first face of a semiconductor substrate having the first face and a second face;
   forming a first region by implanting ions in the semiconductor substrate through the first trench;
   forming a first insulator in the first trench after the forming the first region; and
   forming a second trench on the side of the first face of the semiconductor substrate after the forming the first insulator,
   wherein a depth of a bottom surface of the second trench with reference to the first face is smaller than a depth of a bottom surface of the first trench with reference to the first face.

2. The method according to claim 1, wherein
   the first face of the semiconductor substrate has a region in which the first trench exists and an other region other than the region, and
   in the forming the first region, the ions are implanted in the semiconductor substrate through the first trench in a state in which the other region is masked.

3. The method according to claim 1, further comprising arranging a first separation member in the first trench after the forming the first region and before the forming the second trench in the semiconductor substrate.

4. The method according to claim 3, wherein in the forming the second trench, part of the first separation member and part of the semiconductor substrate are removed.

5. The method according to claim 3, wherein in the forming the second trench, part of the first region is removed.

6. The method according to claim 3, further comprising arranging a second separation member in the second trench, wherein the second separation member contacts at least one of the first separation member and the first region.

7. The method according to claim 3, wherein
in the forming the second trench, the semiconductor substrate is etched such that an upper portion of the first separation member protrudes from the bottom surface of the second trench,
the method further comprises arranging a second separation member in the second trench, and
a lower end of the second separation member has a concave portion, and an upper portion of the first separation member is fitted in the concave portion of the second separation member.

8. The method according to claim 3, wherein
in the forming the second trench, a plurality of trenches including the second trench are formed, and
the plurality of trenches include the second trench formed on the first separation member so as to expose the first separation member and a third trench formed on a region where the first separation member does not exist.

9. The method according to claim 1, further comprising forming a charge accumulation region in the semiconductor substrate,
wherein the first region is positioned between the charge accumulation region and the first trench.

10. The method according to claim 1, further comprising thinning the semiconductor substrate by removing part of the semiconductor substrate on a side of the second face, wherein in the thinning the semiconductor substrate, the semiconductor substrate is thinned such that at least part of the first region is removed.

11. The method according to claim 1, wherein the semiconductor substrate contains silicon, and the ions are group 14 element ions excluding silicon.

12. The method according to claim 11, wherein
a depth of the bottom surface of the first trench with reference to the first face is not less than 0.5 μm,
the first region formed in the forming the first region includes a first portion positioned under a bottom of the first trench and a second portion positioned at a lateral side of the first trench, and
a concentration of the group 14 element in the first portion is higher than that in the second portion.

13. A method of manufacturing a semiconductor apparatus, comprising:
preparing a semiconductor substrate having a first face and a second face;
forming a first trench on a side of the first face of the semiconductor substrate;
forming a first region by implanting carbon ions in the semiconductor substrate through the first trench;
forming a first insulator in the first trench; and
forming a second trench on a side of the first face of the semiconductor substrate after the forming the first insulator,
wherein a depth of a bottom surface of the second trench with reference to the first face is smaller than that of the first trench with reference to the first face.

14. The method according to claim 13, wherein in the forming the second trench, a side surface of the first trench on the side of the first face and part of the first region are removed.

15. The method according to claim 11, wherein the ions include carbon ions.

16. The method according to claim 1, further comprising forming a second insulator in the second trench, wherein a side surface of the first insulator is arranged between a bottom surface of the second insulator and the first face.

17. The method according to claim 13, further comprising forming a second insulator in the second trench, wherein a side surface of the first insulator is arranged between a bottom surface of the second insulator and the first face.

18. The method according to claim 10, wherein after the thinning, a third face of the semiconductor substrate opposite to the first face includes the first region and the first insulator.

19. The method according to claim 13, further comprises thinning the semiconductor substrate by removing part of the semiconductor substrate on a side of the second face,
wherein in the thinning the semiconductor substrate, the semiconductor substrate is thinned such that at least part of the first region is removed, and a third face of the semiconductor substrate opposite to the first face includes the first region and the first insulator.

20. the method according to claim 1, wherein in the forming the first region, the first region is formed in the semiconductor substrate such that the first region surrounds the first trench in the semiconductor substrate.

21. the method according to claim 13, wherein in the forming the first region, the first region is formed in the semiconductor substrate such that the first region surrounds the first trench in the semiconductor substrate.

* * * * *